United States Patent [19]
Tanaka et al.

[11] Patent Number: 5,917,857
[45] Date of Patent: Jun. 29, 1999

[54] DIGITAL MODULATION APPARATUS, A DIGITAL MODULATION METHOD, AND A RECORDING MEDIUM THEREFOR

[75] Inventors: Shin-ichi Tanaka, Kyoto; Toshiyuki Shimada, Hyogo; Tadashi Kojima; Koichi Hirayama, both of Kanagawa; Yoshiaki Moriyama; Fumihiko Yokogawa, both of Saitama; Takao Arai; Toshifumi Takeuchi, both of Kanagawa, all of Japan

[73] Assignees: Matsushita Electric Industrial Co., Ltd., Osaka; Kabushiki Kaisha Toshiba, Kanagawa; Pioneer Electronic Corporation; Hitachi, Ltd., both of Tokyo, all of Japan

[21] Appl. No.: 08/764,024

[22] Filed: Dec. 11, 1996

[30] Foreign Application Priority Data

Dec. 13, 1995 [JP] Japan .................................. 7-324169

[51] Int. Cl.⁶ .............................. H04B 14/04; H03M 7/00
[52] U.S. Cl. .......................... 375/253; 358/261.1; 341/59
[58] Field of Search .............................. 375/253; 341/59, 341/58; 358/261.1, 261.2

[56] References Cited

U.S. PATENT DOCUMENTS

| 4,520,346 | 5/1985 | Shimada .................................... 341/58 |
| 4,728,929 | 3/1988 | Tanaka ...................................... 341/73 |
| 4,988,999 | 1/1991 | Uehara et al. ............................. 341/59 |
| 5,196,848 | 3/1993 | Sakazaki .................................... 341/58 |
| 5,469,162 | 11/1995 | Chaki et al. ............................... 341/58 |

FOREIGN PATENT DOCUMENTS

| 0126609 | 11/1984 | European Pat. Off. . |
| 0471130 | 2/1992 | European Pat. Off. . |
| 0472375 | 2/1992 | European Pat. Off. . |
| 0597443 | 5/1994 | European Pat. Off. . |

OTHER PUBLICATIONS

Copy of a International Search Report issued Apr. 14, 1997.
S. Kotaori et al.: "Channel Coding Scheme for 3/4 Inch HDTV Digital VCR" (Signal Processing of HDTV, IV, Proceedings of the International Workshop on HDTV '92, Kawasaki, Japan, Nov. 18–20, 1992, ISBN 0-444081551-1, 1993, Amsterdam, Elsevier, pp. 253–260/Database Inspec. Institute of Electrical Engineers, Stevenage, GB, Inspection No. 4630995. XP000670637).
S. Kitaori et al.: Channel Coding Scheme for 3/4 Inch HDTV Digital VCR (Signal Processing: Image Communication, Dec. 1993, Netherlands, Vol. 5, No. 5–6, ISSN 0923-5965, pp. 425–430, XP000426714).
K.A.S. Immink, "EFMplus: The Coding Format of the Multimedia Compact Disc" (IEEE Transactions on Consumer Electronics, Aug. 1995, U.S.A., vol. 41, No. 3, ISSN 0098-3063, pp. 491–497, XP000539497).
An article by Kees A. Schouhamer Immink, entitled "EFM-Plus: The Coding Format of the High–Density Compact Disc", published on pp. 80–81 of the IEEE (May, 1995).

*Primary Examiner*—Stephen Chin
*Assistant Examiner*—Betsy L. Deppe
*Attorney, Agent, or Firm*—Greenblum & Bernstein, P.L.C.

[57] ABSTRACT

A digital modulation apparatus applies a method for converting data words to runlength-limited code words using plural conversion tables. The data words are converted to code words that significantly suppress the low frequency component of the final nonreturn-to-zero inverted signal.

This digital modulation apparatus includes ROM tables for storing plural conversion tables containing the runlength-limited code words corresponding to the data words; end-runlength memories and evaluators for determining whether the runlength-limit constraints are satisfied in the interconnection between two consecutive code words when the data words to be converted are supplied; and a DSV controller for storing each of the code words that can be selected from two conversion tables to buffer memories when the runlength-limit constraints are satisfied, and selecting the code words wit the greatest effect suppressing the low frequency component in the obtained signal when the code words are NRZI converted.

6 Claims, 10 Drawing Sheets

Fig. 3

| D(i), 8bit | 0 | 1 | 0 | 0 | 1 | 1 | 0 | 1 |
|---|---|---|---|---|---|---|---|---|
| C(i), 16bit | 0 0 | 1 0 | 0 0 | 0 1 | 0 0 | 0 0 | 1 0 | 0 |
| $S_{NRZI}$ | | | | | | | | |

Fig.10 PRIOR ART

| | Tpc(m=1) | | | Tsc(m=1) | | |
|---|---|---|---|---|---|---|
| | D | C | NS | D | C | NS |
| STATE1 | 00000000 | 0010000000001001 | 1 | 00000000 | 0001000100000000 | 4 |
| | 00000001 | 0000010000000100 | 2 | 00000001 | 0010001000000010 | 1 |
| | ⋮ | ⋮ | ⋮ | ⋮ | ⋮ | ⋮ |
| | 11111110 | 0000010000000100 | 3 | 01010111 | 0000010000100001 | 1 |
| | 11111111 | 0010000001000010 | 1 | | | |

| | Tpc(m=2) | | | Tsc(m=2) | | |
|---|---|---|---|---|---|---|
| | D | C | NS | D | C | NS |
| STATE2 | 00000000 | 0100000000100010 | 1 | 00000000 | 0001000100000000 | 4 |
| | 00000001 | 0000010000000100 | 2 | 00000001 | 0010001000000010 | 1 |
| | ⋮ | ⋮ | ⋮ | ⋮ | ⋮ | ⋮ |
| | 11111110 | 0000010000000100 | 3 | 01010111 | 0000010000100001 | 1 |
| | 11111111 | 0010000001000010 | 1 | | | |

| | Tpc(m=3) | | | Tsc(m=3) | | |
|---|---|---|---|---|---|---|
| | D | C | NS | D | C | NS |
| STATE3 | 00000000 | 0001000000001001 | 1 | 00000000 | 1001000000000100 | 2 |
| | 00000001 | 1000000010000100 | 2 | 00000001 | 0010010000001001 | 1 |
| | ⋮ | ⋮ | ⋮ | ⋮ | ⋮ | ⋮ |
| | 11111110 | 1000000010000000 | 4 | 01010111 | 1000100000000010 | 1 |
| | 11111111 | 1000000001000100 | 3 | | | |

| | Tpc(m=4) | | | Tsc(m=4) | | |
|---|---|---|---|---|---|---|
| | D | C | NS | D | C | NS |
| STATE4 | 00000000 | 0100000000100010 | 1 | 00000000 | 1001000000000100 | 2 |
| | 00000001 | 1000000010000100 | 2 | 00000001 | 0100001000000010 | 1 |
| | ⋮ | ⋮ | ⋮ | ⋮ | ⋮ | ⋮ |
| | 11111110 | 1000000010000000 | 4 | 01010111 | 1000100000000010 | 1 |
| | 11111111 | 1000000001000100 | 3 | | | |

Fig.11 PRIOR ART

| Convertion Table | Number of zero at the code top(NZCT) | 1st & 13rd bit |
|---|---|---|
| Tpc(m=1) & Tsc(m=1) | 2≦NZCT≦9 | 'XX' |
| Tpc(m=2) & Tsc(m=2) | 1≦NZCT≦5 | '00' |
| Tpc(m=3) & Tsc(m=3) | 0≦NZCT≦5 | not '00' |
| Tpc(m=4) & Tsc(m=4) | 0 or 1 | 'XX' |

Fig.12 PRIOR ART

| Number of zero at the code end (NZCE) | Next state |
|---|---|
| 0 or 1 | STATE1 |
| 2≦NZCE≦5 | STATE2 or STATE3 |
| 6≦NZCE≦9 | STATE4 |

DIGITAL MODULATION APPARATUS, A DIGITAL MODULATION METHOD, AND A RECORDING MEDIUM THEREFOR

BACKGROUND OF THE INVENTION

1. Field of the Invention

The present invention relates to a digital modulation apparatus used with optical disk media, and relates particularly to a modulation technique applicable to suppressing the low frequency component of a non-return-to-zero inverted (NRZI) signal.

2. Description of the Prior Art

Digital modulation and demodulation apparatuses used for recording and reproduction with an optical disk medium are typically comprised as shown by the block diagram in FIG. 8. A conventional digital modulation and demodulation apparatus DMC includes a modulating unit 1000 for modulating data word to a non-return-to-zero inverted (NRZI) signal $S_{NRZI}$, an optical head OH for writing and reading the signal $S_{NRZI}$ to and from an optical disk OD, and a demodulator 2000 for demodulating the read signal $S_{NRZI}$ to the original data word.

Specifically, during modulation the data words D(i) by the modulator 1000 are first converted to code words C(i) suited to recording to an optical disk OD by means of a code converter 1001. The converted code words C(i) are then converted to a non-return-to-zero inverted (NRZI) signal $S_{NRZI}$ by an NRZI converter 1002. Note that "i" is an integer representing the inputting order of the corresponding data words, and is therefore not greater than the total number of the inputted data words. The resulting NRZI signal $S_{NRZI}$ is then written to the optical disk OD by the optical head OH.

The NRZI signal $S_{NRZI}$ is read out from the optical disk OH for the demodulation by the demodulator 2000. During demodulation, the NRZI signal $S_{NRZI}$ is reversed (demodulated or converted back) to the code word C(i). This reversed code word C(i) is reversed to the data word D(i). Thus, the conversion process performed by the modulator 1000 is reversed to read the original data word D(i). The correlation between the data words D(i), code words C(i), and NRZI signal $S_{NRZI}$ in this process is as shown in FIG. 9 by way of example.

EFM Conversion

One method of converting data words D(i) to code words C(i) in a code converter is eight-to-fourteen modulation (EFM) conversion. This EFM conversion method expressed in (d,k; m,i) terms is a (2,10; 8,17) code sequence constraint conversion method where d is the minimum runlength permitted in each code word C(i), k is the maximum runlength permitted in each code work C(i), m is the length of the data word D(i), and i is the length of the code word C(i).

The runlength is the number of bits of the same value which corresponds to a signal-transition after NRZI conversion, e.g., ZERO (0) in this example, between bits of a different value which corresponds to non-signal-transition after NRZI conversion, e.g., ONE (1) in this example. The d and k constraints are the runlength limits, and this type of runlength-limited code is thus usually called a (d, k) code.

More specifically, in EFM conversion an 8-bit data word is first converted to a 14-bit code word. In this example the code word C(i) satisfies a (2, 10) code sequence constraint, resulting in very code word C(i) having at least two and not more than ten zeroes between any two ones in the code word. A 3-bit merging code is then inserted between one 14-bit code word and the next 14-bit code word. Each code word is constructed so that this (2, 10) code sequence constraint is also satisfied in the 17-bit code sequence containing a code word C(i) and the transition (merging) code.

The transition code is selected such that, in addition to satisfying the code sequence constraint, the absolute value of the digital sum variation (DSV) is reduced to minimize the low frequency component of the channel signal, i.e., the NRZI signal $S_{NRZI}$. Note that the DSV is accumulated from the beginning of the binary bit sequence where the bits of one bit state have a value of +1 and the bits of the other state have a value of -1.

It is known that the low frequency component of the bit sequence can be suppressed by controlling the conversion process to minimize the absolute value of the DSV. It is desirable to suppress the low frequency component of the NRZI signal $S_{NRZI}$ to prevent read errors caused by threshold value fluctuation when the signal is digitized during reproduction, or to prevent fluctuation in the servo error signal during recording and reproduction.

EFM conversion is thus an effective conversion method with respect to suppressing the low frequency component of the NRZI signal $S_{NRZI}$, but it is not a completely satisfactory conversion method when used with the high recording densities of the latest optical disk media.

EFMplus Conversion

EFMplus is a modified EFM conversion method designed for improved performance with high density recording (cf., Kees A. Schouhamer-Immink, "EFMPlus: The Coding Format of the High-Density Compact Disc," IEEE, 1995). The EFMplus conversion is a (2, 10; 8, 16) code sequence constraint conversion method achieving a 17/16 improvement in recording density when compared with EFM conversion corresponding to (2,10; 8,17) code sequence constraint conversion as described above. In the EFMplus conversion method, an eight-to-fourteen modulation (EFM) conversion is extended to an eight-to-sixteen modulation (ESM), wherein an 8-bit data word D(i) is converted to a 16-bit code word C(i).

Whereas EFM conversion uses a single static conversion table, EFMplus conversion selects one conversion table from several available conversion tables according to specific rules each time a data word is presented for conversion, and uses the selected conversion table to convert the data word to a code word. Note that the use of a specified single conversion table is called a "state" corresponding to that conversion table.

FIG. 10 is one example of possible conversion tables Tpc(m) and Tsc(m) used in the EFMplus conversion method. There is a total of eight tables, grouped according to four states (state 1 to state 4), with two tables (a primary and secondary) associated with each state. The primary conversion tables are indicated by symbols Tpc(m), wherein "m" corresponds to the state numbers. For example, m=1 means the primary conversion table Tpc(m=1) for the state 1. Similarly, m=2, 3 and 4 mean the primary conversion tables Tpc(m=2) for the state 2, Tpc(m=3) for the state 3, and Tpc(m=4) for the state 4, respectively. In the same manner, the secondary conversion table Tsc(m) are also identified by "m" (m=1 . . . 4).

Each primary conversion table Tpc(m) contains all of the data words that can be expressed with eight bits, i.e., 256 data words, and the 16-bit code words corresponding to each of these data words. Each secondary conversion table Tsc (m) contains a finite selection of data D words, specifically 88 data words from 00000000 to 01010111, and the corresponding code words C. Both the primary and secondary conversion tables Tpc(m) and Tsc(m) contain a next state indicator NS, which contains one of four values (from 1 to 4), each indicating the state of the next conversion.

More specifically, the state of the next conversion, i.e., the primary or secondary conversion table Tpc(m) and Tsc(m) to be used for the next conversion, is designated by the code word C(i−1) obtained from the immediately preceding conversion. The next state designation by each code word is predetermined based on that code word's runlength (number of last successive zeroes). This step ensures that the (2, 10) constraints are satisfied even in the interconnection between code words C(i−1) and C(i) as shown in FIG. 10 and FIG. 11. Note that the first conversion table Tpc(m=1) and Tsc(m=2) are used for the first data word D(i) to be converted, i.e., the data word following the first synchronization code.

As shown in FIG. 11, each of these conversion tables Tpc(m) and Tsc(m) is compiled so that the code words contained in a single conversion table all share a common characteristic. For example, the code words contained in the second conversion tables Tpc(m=2) and Tsc(m=2) all have an initial runlength of at least 1 and not more than 5 zeroes, with the first bit and the thirteenth bit both being zero. Note that "X" in the table (FIG. 11) indicates that the bit value may be one or zero.

The method of selecting one of these eight conversion tables each time one data word is supplied is described below.

(1) The first step is to determine the state of the next conversion NS(i−1) according to the designation by previous code word C(i−1) in a manner described above.

(2) If the next data word D(i) to be converted is in the range 00000000 to 01010111, i.e., is data word 87 or less, the primary table Tpc(m) or secondary conversion table Tsc(m) converting the data word D(i) to a code word C(i) achieving maximum suppression of the low frequency component in the NRZI signal $S_{NRZI}$ is selected. It will be obvious that if the data word D(i) to be converted is not within the above range, a primary conversion table Tpc(m) will always be used.

The EFMplus conversion method thus converts one data word D(i) to one code word C(i).

It should be noted, however, that there is a certain amount of duplication in the code words C(i) contained in each of the conversion tables Tpc(m) and Tsc(m) shown in FIG. 10. More specifically, the same code word C(m) can be assigned to different data words D(i) depending upon the selected state. The four code words C(i) surrounded by a rectangular frame in the tables in FIG. 10 are such duplicate words. It is therefore necessary to ensure that during demodulation, i.e., when re-converting one of these duplicate code words C(i) to the corresponding data word, the code word is uniquely decoded to the original data word.

This is achieved in EFMplus conversion by shifting to the next state, i.e., state 2 or state 3, when a data word D(i) is converted to a duplicate code word C(i). Whether conversion is shifted to state 2 or state 3 is determined by which of the different data words the data words D(i) to be converted is. As a result, when the code word C(i) read from the optical disk OD is demodulated, it can be uniquely decoded to the original data word D(i) even if the code word C(i) is a duplicate code word, because the state following that code word C(i) is known.

It will be obvious that the state NC(i) of the read code word C(i) can be known during demodulation by using the rules shown in FIG. 11 and FIG. 12. More specifically, as shown in FIG. 12, it can be determined whether the code word was converted in state 1, (2 or 3), or 4 from the runlength at the end of the code word C(i−1) read immediately before the code word C(i) being decoded. It can also be determined whether the code word was converted in state 2 or state 3 from the values of code word bits 1 and 13 as shown in FIG. 11.

It is therefore possible by means of EFMplus conversion to uniquely convert an 8-bit data word to a 16-bit code word C(i), and to uniquely decode the code word C(i) to the original data word D(i).

While EFMplus conversion thus improves upon the EFM conversion method with respect to the achievable recording density, its performance in terms of suppressing the low frequency component of the NRZI signal $S_{NRZI}$ is inferior to that of EFM conversion. More specifically, while EFMplus conversion improves the recording density by 17/16 compared with EFM conversion, low frequency component suppression deteriorates by approximately 3 dB.

SUMMARY OF THE INVENTION

The object of the present invention is therefor to provide a digital modulation apparatus which solves these problems.

The present invention has been developed with a view to substantially solving the above described disadvantages and has for its essential object to provide an improved digital modulation apparatus.

In order to achieve the aforementioned objective, a digital modulation apparatus for converting data words to runlength-limited code words comprises storage means for storing plural sets of conversion tables correlating the code words to the data words, selection means for selecting, from among the plural conversion tables, the next conversion table to be used based on the code word obtained from the immediately preceding conversion, and reading means for reading and outputting the code word corresponding to the data word to be converted from the conversion table selected by said selection means.

The selection means selects a set of conversion tables that converts the data word to the code word so that the runlength constraint is also satisfied in the interconnection between the code word obtained by the immediately preceding conversion and the code word obtained by the following conversion. When there are plural sets of conversion tables, each of which assigns the code words being able to be decoded to the original data word, the conversion table selected is the conversion table assigning the code word resulting in the most favorable digital sum variation in the signal, after the code words are non-return-to-zero inverted converted.

BRIEF DESCRIPTION OF THE DRAWINGS

The present invention will become more fully understood from the detailed description given below and the accompanying diagrams wherein:

FIG. 3 is a graph showing one example of all conversion tables that may be used in the EFMplus conversion method according to the present invention, FIG. 10 is a graph showing an example of all conventional conversion tables used in the eight-to-sixteen conversion method, FIG. 11 is a table showing the common characteristics of the code words contained in each of the conventional conversion tables shown in FIG. 10, and FIG. 12 is a table showing the relationship between a code word and the state of the next conversion with respect to the conventional conversion tables shown in FIG. 10.

DESCRIPTION OF THE PREFERRED EMBODIMENTS

Structure of the Digital Modulation Apparatus

Figure 1:
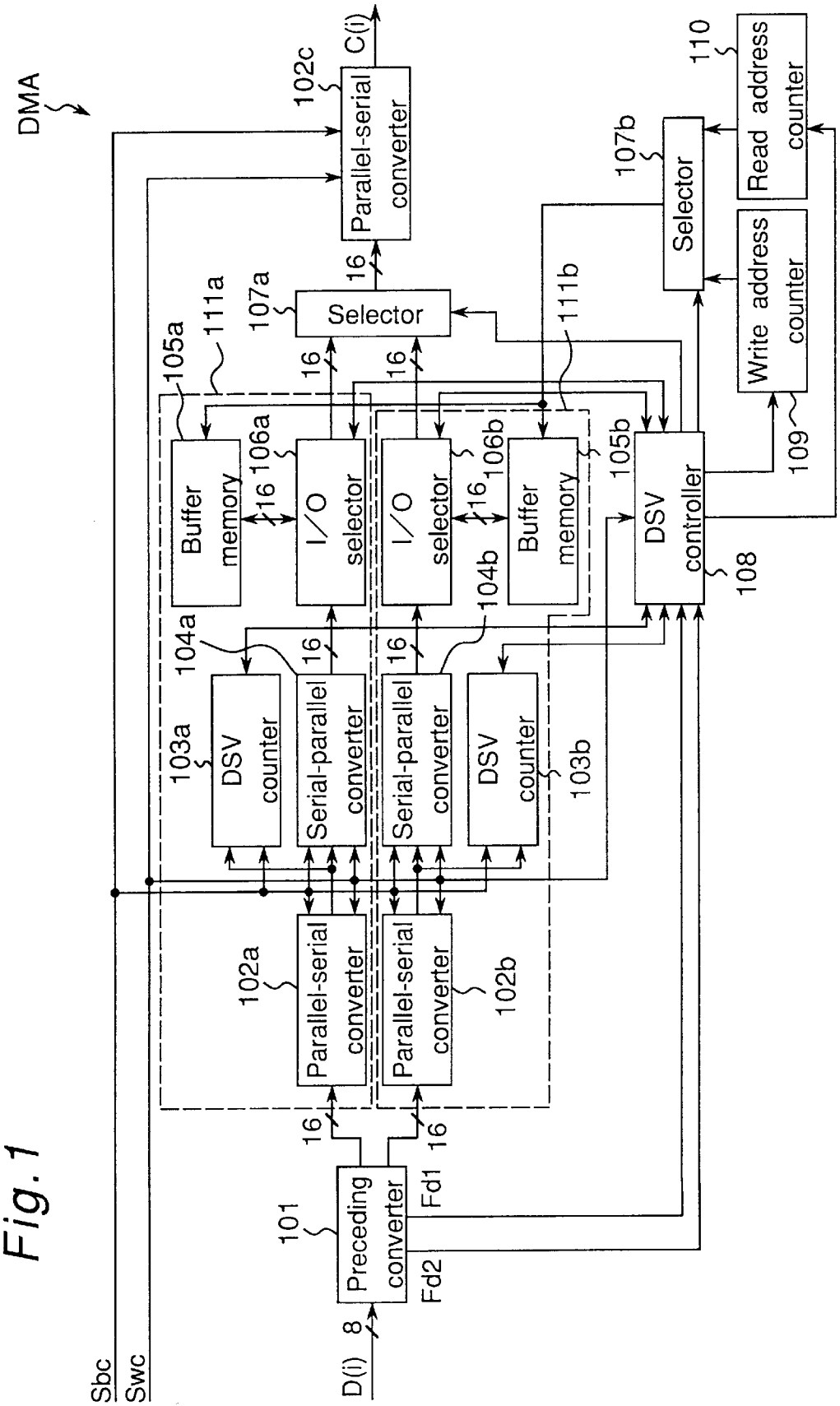
FIG. 1 is a block diagram showing a digital modulation apparatus according to the present invention.

Referring to FIG. 1, a digital modulation apparatus according to the present invention is shown. This digital modulation apparatus DM comprises a preceding converter 101, parallel-serial converters 102a, 101b, and 102c, DSV counters 103a and 103b, serial-parallel converters 104a and 104b, buffer memories 105a and 105b, input/output (I/O) selectors 106a and 106b, selectors 107a and 107b, DSV controller 108, write address counter 109, and read address counter 110.

The preceding converter 101 is connected to an external data word source (not shown) for receiving an 8 bit data word D(i) therefrom. Note that "i" is an integer indicating the inputting order of corresponding data words, and is used as an input byte counter. Then, the preceding converter 101 procudes two 16 bit word candidates, C1(i) and C2(i), for that data word and two DCC flags, Fd1 and Fd2. These DCC flags (Fd1 and Fd2) declare whether DSV control is possible with eac of the data words D(i), where "SDV controllable" means that two code words C(i) can be selected for conversion of the one data word D(i). This selection can minimize the absolute value of the DSV after NRZI conversion of the selected code word C(i). Note that DSV control is also referred to as DCC (DC control). A detailed description of the structure of the preceding converter 101 will be described later with reference to FIG. 2.

The first parallel-serial converter 102a is connected to the preceding converter 101 for receiving the first code word candidate C1(i) therefrom. The first parallel-serial converter 102 is further connected to an external word clock source (not shown) for receiving a word clock signal Swc transmitted with each code therefrom, and to an external code word bit clock source (not shown) for receiving a code word bit clock Sbc transmitted by code word bit unit therefrom.

The first parallel-serial converter 102a converts the 16-bit parallel code word candidate Cl(i) to a serial code word, and outputs a serial code word sequence. Note that conversion and output are synchronized to the word clock signal Swc and the code word bit clock signal Sbc. The 16-bit parallel code words and serial code words are referred to as "parallel code word" and "serial code word", respectively.

The first DSV counter 103a is connected to the first parallel-serial converter 102a for receiving the thus converted serial code word and the serial code word sequence therefrom. The first DSV counter 103a is further connected to the external code word bit clock source for receiving the clock signal Sbc therefrom. Based on these data, the DSV counter 103a counts the DSV of each serial code word and accumulates a DSV. More specifically, the DSV counter 103 includes an up/down-counter which counts zero, and is reciprocally switched between up-count mode and down count mode when a one in a serial code is detected.

The first serial-parallel converter 104a is connected to the first parallel-serial converter 102a for receiving the serial code word and the serial code word sequence therefrom. The first serial-parallel converter 104a is further connected to the external code word bit clock source and the word clock source for receiving the clock signals Sbc and Swc, respectively, therefrom. Based on these data, the first serial-parallel converter 104a converts the serial code words to a 16-bit parallel code word C(i).

The DSV controller 108 is connected to the preceding converter 101 for receiving the flags Fd1 and Fd2 therefrom, and is further connected to the first DSV counter 103a for receiving a first DSV counted value DSV1 therefrom and sending a first DSV counter update signal thereto. The DSV controller 108 is also connected to the second DSV counter 103b for receiving a second DSV counted value DSV2 therefrom and sending a second DSV counter update signal thereto. Specifically, the controller 108 updates the counted value of either one of first and second DSV counters 103a and 103b whose counted value is inferior by the counted value of the other DSV counter 103.

The DSV controller 108 comprises a CPU, ROM, and RAM, forming a controller, controlling DSV accummulation using a so-called look-ahead method. The DSV controller 108 more specifically controls the component elements based on the DCC flags Fd1 and Fd2 supplied from the preceding converter 101, and the information from the DVS counters 103a and 103b.

This look-ahead method is a technique used when there are two code words that could be selected for a particular data word, i.e., when DSV control is possible. In this DSV controllable state, the decision as to which of the two code words should be used is postponed until a DSV control state occurs again, at which time a decision is made to select the code word for the first DSV control state resulting in the lowest absolute value of the DSV accummulated by the time the second DSV control state is encountered.

The selection of a set of conversion tables is based only on the code word converted immediately before the data word is selected as a particular data word.

More specifically, the DSV controller 108 ultimately determines which of the two code words output from the preceding converter 101 will result in the greatest low frequency component suppression in the final NRZI signal, and selects that code word. The details of this operation are described below with reference to a flow chart.

Based on these signals DSV1, DSV2, Fd1, and Fd2, the DSV controller 108 produces an I/O selector control signals for controlling the I/O selectors 106a and 106b. The DSV controller 108 further produces a selector control signals for controlling the selectors 107a and 107b.

The second selector 107b is connected to the DSV controller 108 for receiving the selector control signal to select read/write address therefrom.

The first I/O selector 106a is connected to the first serial converter 104a for receiving the 16-bit parallel code word C(i) therefrom, and is further connected to the DSV controller 108 for receiving the 16-bit data C(i) data to write therefrom and sending the data read therefrom.

The first buffer memory 105a is connected to the first I/O selector 106a for selectively exchanging the 16-bit parallel code word C(i) thereto based on a control signal from the DSV controller 108. The first buffer memory 105a is further connected to the second selector 107b for receiving the read/write address therefrom.

The first buffer memory 105a accumulates and stores parallel code words. Note that the write and read addresses to the buffer memory 105a are supplied through selector 107b, from the write address counter 109 and the read address counter 110, as controlled by the DSV controller 108.

The first selector 107a is connected to the first I/O selector 106a for receiving the first code word C1(i) therefrom.

The first I/O selectors 106a is controlled by the DSV controller 108 to store the parallel code word C(i) from the first serial-parallel converters 104a to the first buffer memory 105a, or to read and output the parallel code words C(i) stored in the buffer memory 105a to the first selector 107a.

Thus, the first parallel-serial converter 102a, DSV counter 103a, Serial-parallel converter 104a, buffer memory 105a, and I/O selector 106a construct a first look-ahead unit 111a which temporarily stores the first code word candidate C1(0) until the evaluation of the first code word candidate C1(i) with respect to the second code word candidate C2(i), and outputs thus stored first candidate code words C1(0) to C1(i−1) to the first selector 107a.

Similarly, the second parallel-serial converter 101b, DSV counter 103b, Serial-parallel converter 104b, buffer memory 105b, and I/O selector 106b construct a second look-ahead unit 111b which temporarily stores the second code word candidate C2(0) to C2(i), and outputs the stored second candidate code words C2(0) to C2(i−1) to the first selector 107a.

Specifically, the DSV controller 108 controls the first and second look-ahead units 111a and 111b to store the first and second candidate code words C1(0) to C1(i−1) and C2(0) to C2(i−1) until it is determined that which candidate code words C1(0) or C2(0) is good. Then, the candidate code word determined as good is outputted therefrom.

Figure 2:
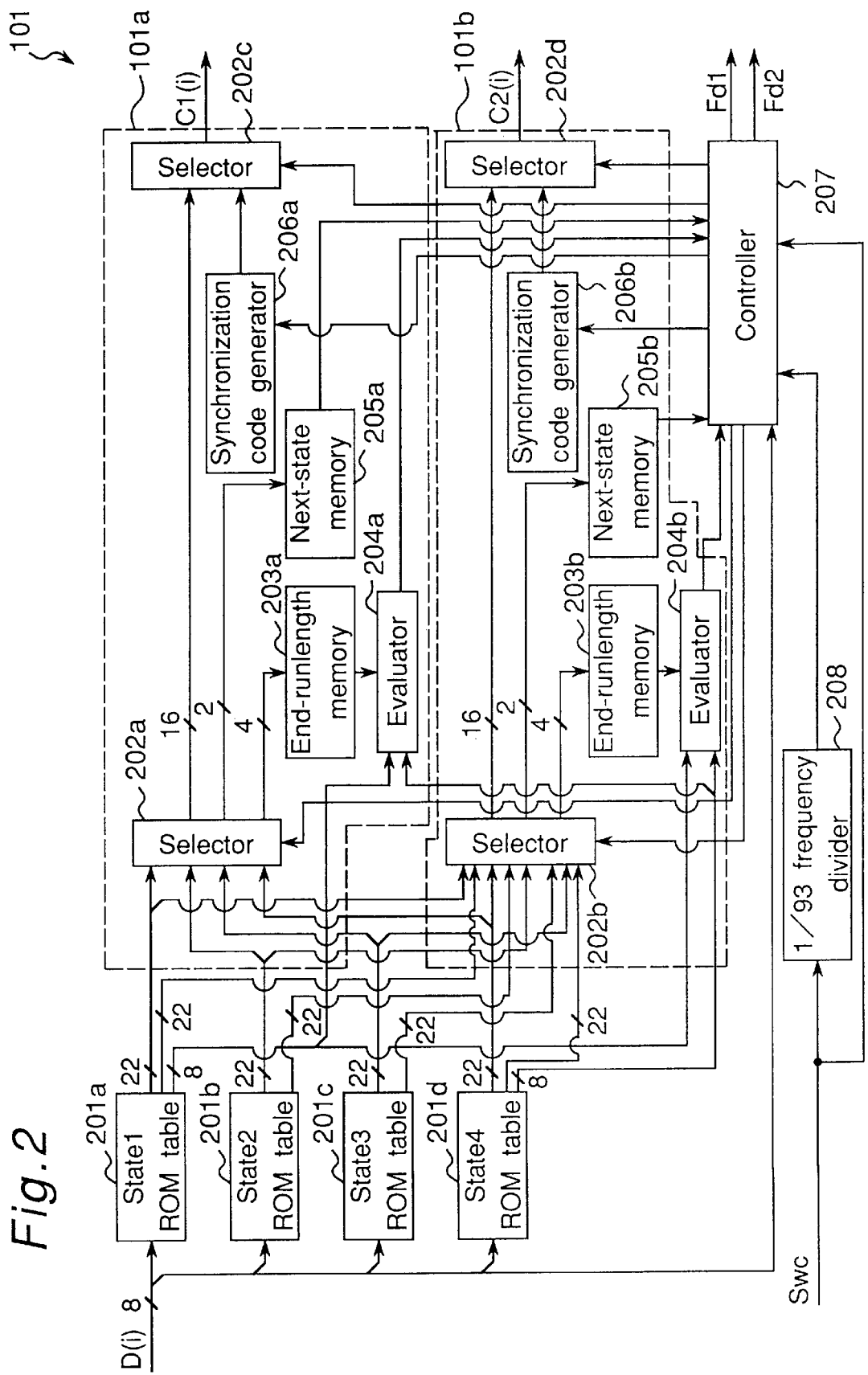
FIG. 2 is a block diagram showing the specific configuration of the preceding converter 101 shown in FIG. 1.

Referring to FIG. 2, the specific configuration of the preceding converter 101 is shown. The preceding converter 101 further comprises ROM tables 201a, 201b, 201c, and 201d, selectors 202a, 201b, 202c, and 202d, end-runlength memory units 203a and 203b, evaluators 204a and 204b, next-state memory 205a and 205b, synchronization code generator 206a and 206b, controller 207, and 1/93 frequency divider 208. The ROM tables 201a, 201b, 201c, and 201d store all of the eight-to-sixteen conversion tables according to the present invention by state.

Figure 3:
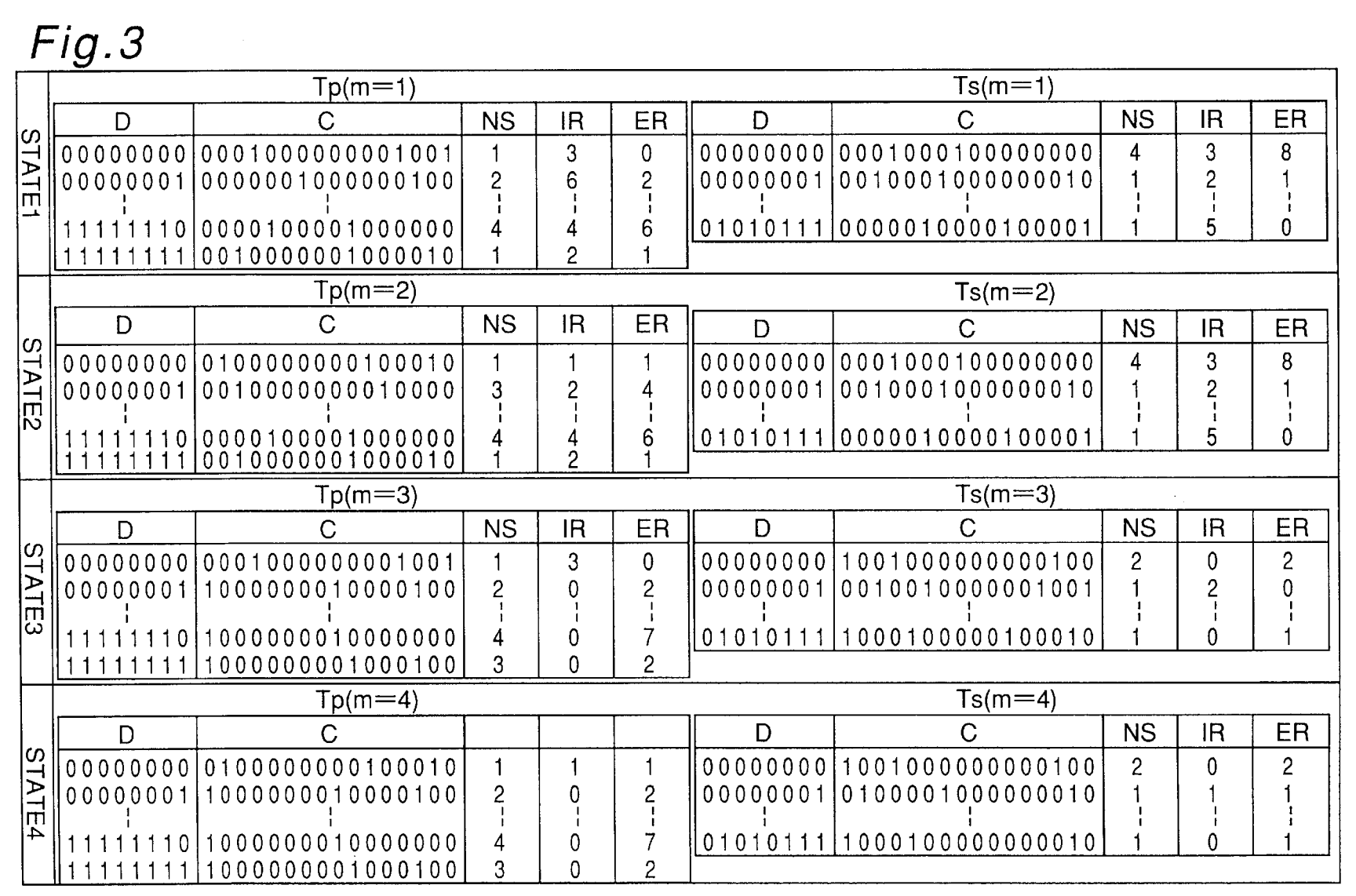
Figures 8, 9:
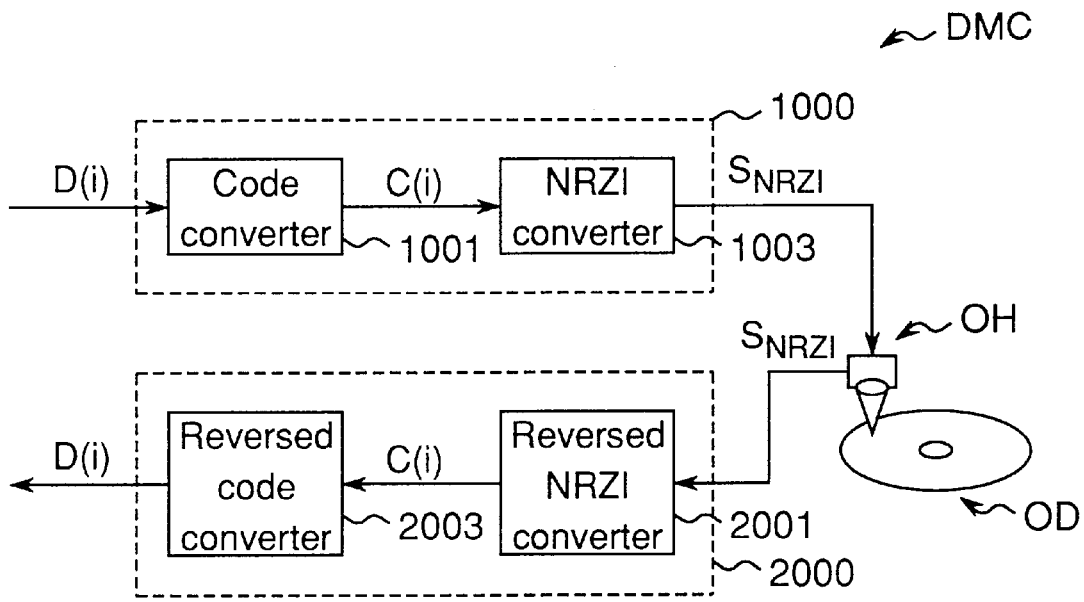
FIG. 8 is a block diagram showing a conventional digital modulation and demodulation apparatus.
FIG. 9 is a table illustrating the correlation between the data word, code word, and resulting NRZI signal with respect to the conventional digital modulation and demodulation apparatus of FIG. 8.

Referring to FIG. 3, conversion tables Tp(m) and Ts(m) used in the eight-to-sixteen conversion method according to the present invention is shown. Similarly to the tables Tpc(m) and Tsc(m) shown in FIG. 8, there is a total of eight tables and grouped according to four states (STATE1 to STATE4) with two tables, a primary and secondary, associated with each state. The primary conversion tables are indicated by symbols Tp(m), wherein m corresponds to the state numbers. The secondary conversion table Ts(m) are also identified by m its corresponding state. In this sense, m is referred to as "state index".

The primary conversion tables Tp(m) contain all sorts of data words D that can be expressed with eight bits, i.e., 256 sorts of data words, the 16-bit code words C, and the 2-bit next state indicators NS. The 16-bit code words C and the next state indicators NS(i) both correspond to each of these data words D.

The secondary conversion tables Ts(m) contain a finite selection of data words D, specifically the 88 data words from 00000000 to 01010111, the corresponding code words C, and the corresponding next state indicators NS.

The conversion tables correlate only code words in which an initial runlength is within the range defined for each type of conversion table.

Both the primary and secondary conversion tables Tp(m) and Ts(m) further contain 4-bit beginning runlength indicators IR and 4-bit runlength indicators ER. Both runlength indicators IR and ER are also corresponding to the preceding code word C.

Specifically, the state1 ROM table 201 a stores a first primary conversion table Tp(m=1) and a secondary conversion table Ts(m=1) for the first state STATE1 shown in FIG. 3. The other ROM tables 201b, 201c, and 201d similarly store corresponding primary and secondary conversion tables Tp(m=2, 3, and 4) and Ts(m=2, 3, and 4) for the second state STATE2, the third state STATE3, and the fourth state STATE4, respectively. Each ROM table also stores information identifying the attributes of each code word C including the next state NS(i), the beginning runlength IR and end runlength ER, as described in the above, in addition to the code words C themselves.

When an i-th 8-bit data word D(i) is input to the state1 ROM table 201a and the state4 ROM table 201d, each of ROM tables 201a and 201d outputs a 26-bit data block corresponding to that inputted data word D(i) therefrom. This 26-bit data block is divided into a 22-bit block and a 4-bit block.

The 22-bit block contains the 16-bit code word C(i), 4 bits end runlength indicator ER(i) declaring the end runlength of that code word C(i), and 2 bits next state indicator NS(i) declaring the next state. The 4-bit block is the beginning runlength indicator IR(i) declaring the beginning runlength of that code word C(i).

However, when an 8-bit data word D(i) is supplied to the other ROM tables 201b and 201c, only the 22-bit block containing the 16-bit code word C(i), the 4 bits end runlength indicator ER(i), and 2bits next state indicator NS(i) is selected and output therefrom.

Referring back to FIG. 2, the controller 207 is connected to the external data word source (not shown) for receiving the data word D(i), and is further connected to an external word clock source (not shown) directly and through the 1/93 frequency divider 208 to receive the word clock signal Swc and 1/93 frequency divided word clock, respectively, therefrom.

The third selector 202a is connected to each of primary tables Tp(m) in the ROM tables 201a, 201b, 201c, and 201d for receiving the 22-bit block therefrom. Similarly, the fourth selector 201b is connected to each primary table Tp(m) and further to each secondary table Ts(m) in ROM tables 201a, 201b, 201c, and 201d for receiving the 22-bit block therefrom, respectively. Note that one of 22-bit data is output in parallel from each of the ROM tables 201a, 201b, 201c and 201d to the third selector 202a, and however two of 22-bit data are output in parallel from each of the ROM tables 201a, 201b, 201c, and 201d to the fourth selector 201b, for compatibility with the look-ahead method, whereby code words C1(i) and C2(i) are temporarily stored when there are two code words C1(i) and C2(i) corresponding to one data word D(i), as may occur when the data word D(i) is 87 or fewer. The third and fourth selectors 202a and 201b are both connected to the controller 207 for receiving the selector control signals therefrom.

The selectors 202a and 201b are controlled by the controller 207 to select one of the four ROM tables 201a, 201b, 201c, and 201d, and select only a single of the 22-bit data block out of four 22-bit data blocks (C(i), ER(i), and NS(i)) from the four ROM tables to output therefrom. In other words, the controller 207 selects one of the four ROM tables 201a, 201b, 201c, and 201d based on the evaluation results returned by the evaluators 204a and 204b and the values stored NS(i) in the next-state memory 205a and 205b.

The first end-runlength memory 203a is connected to the first selector 202a for receiving the 4-bit end runlength indicator ER(i) selectively outputted therefrom. Similarly, the second end-runlength memory 203b is connected to the second selector 201b for receiving the 4-bit end runlength indicator ER2(i) selectively outputted therefrom.

The first evaluator 204a is connected to state1 ROM table 201a (STATE1) for receiving two of 4-bit beginning runlength indicator IR(i) therefrom, and to the state4 ROM table 201d (STATE4) for receiving two of 4-bit beginning runlength indicator IR(i). The first evaluator 204a is further connected to the first end-runlength memory 203a for receiving the 4-bit end runlength indicator ER1 (i) therefrom.

The first evaluators 204a adds the end runlength indicator ER1 (i−1) stored by the first end-runlength memory 203a with the beginning runlength indicator IR(i) of the next code word C1(i). The next code word C1(i) is outputted from the ROM tables 201a and 201d individually, and is to determine whether the total runlength thus obtained satisfies the (2, 10) runlength for both STATE1 and STATE4 constraints.

Similarly, the second evaluator 204b is connected to state1 ROM table 201a (STATE1) for receiving the 4-bit beginning runlength indicator IR(i) therefrom, and to the state4 ROM table 201d (STATE4) for receiving the 4-bit beginning runlength indicator IR(i). The second evaluator 204b is further connected to the second end-runlength memory 203b for receiving the 4-bit end runlength indicator ER2(i−1) therefrom.

The second evaluator 204b adds the end runlength indicator ER(i) stored by the second end-runlength memory 230b with the beginning runlength indicator IR(i) of the next code word C2(i). This next code word C2(i) is outputted from the ROM tables 201a and 201d individually, and is used to determine whether the total runlength thus obtained satisfies the (2, 10) runlength constraints for both STATE1 and STATE4. The first and second evaluators 204a and 204b are both connected to the controller 207 for transferring the signals indicative evaluation result thereto.

The significance of the evaluation made by the evaluators 204a and 204b is described below.

As described above, the four ROM tables 201a, 201b, 201c, and 201d sotre the conversion tables shown in FIG. 3, and insofar as the state changes according to the rules shown in FIG. 12, the (2, 10) sequence constraints will be satisfied in the interconnection between successive code words. As a result it may seem that the evaluators 204a and 204b are not needed.

When the next state is state 1 (STATE1) or state 4 (STATE4), however, the state transition in the digital modulation apparatus of the present invention is not automatically determined as designated by the preceding code word C(i−1) statically. Note that the state transition dynamically determined to select either of STATE1 and STATE4 whichever resulting in the best possible DSV control while (2, 10) constraint satisfied in both cases.

Thus, when the first evaluator 204a determines that the code word C1(i) can be selected or data word D(i) is 87 or fewer, the controller 207 sets DCC flag FD1. Likewise, when the second evaluator 204b determines that the code word C2(i) can be selected or the data word D(i) is 87 or fewer, the controller 207 sets DCC flag Fd2.

The first next-state memory 205a is connected to the first selector 202a for receiving the 2-bit next state indicator NS1(i) therefrom. The second next-state memory 205b is connected to the second selector 201b for receiving the 2-bit next state indicator NS2(i) therefrom. The first ad second next-state memories 205a and 205b are both connected to the controller 207 for transferring the two 2-bit next state indicators NS1(i) and NS2(i) stored therein.

The first and second synchronization code generators 206a and 206b are both connected to the controller 207 for receiving the word clock signal Swc and the frequency-divided clock therefrom.

The frequency-divided clock is then used for the timing at which the synchronization clock is output from the synchronization code generators 206a and 206b. Note that while this synchronization code is the synchronization code used during reproduction, one synchronization code (two code words long) is inserted for every 91 code words. More specifically, the synchronization code is inserted on a 93 word clock cycle. Note that for the purposes of DSV control, in the digital modulation apparatus of the present invention, this synchronization code is handled in the same manner as a DSV-controllable code word.

The fifth selector 202c is connected to the third selector 202a for receiving the 16-bit code word C1(i) selectively outputted therefrom, to the first synchronization code generator 206a for receiving the synchronization code therefrom, and to the controller 207 for receiving a control signal therefrom. Similarly, the sixth selector 202d is connected to the fourth selector 201b, the second synchronization code generator 206b, and the controller 207 for receiving the 16-bit code word C2(i), the synchronization code, and a control signal, respectively, therefrom.

Thus, the third selector 202a, first end-runlength memory 203a, the first evaluator 204a, the first next-state memory 205a, the first synchronization code generator 206a, and the fifth selector 202c construct a first pre-converting unit 101a for temporarily storing the input code data C1(i). The fourth selector 201b, second end-runlength memory 203b, the second evaluator 204b, the second next-state memory 205b, the second synchronization code generator 206b, and the sixth selector 202d construct a second pre-converting unit 101b for temporarily storing the code word C2(i), as described in the above.

The selectors 202c and 202d select and output either the code words from the selectors 202a and 201b, or the synchronization code from the synchronization code generator 206a and 206b.

The controller 207 consists of a CPU, ROM, and RAM, and controls determination of the next selectable state and the operating timing of each component. Detailed operation of the controller 207 is described below.

Operation of the Digital Modulation Apparatus

The operation of the digital modulation apparatus comprised as above is described below. First, the conceptual operation is described with reference to FIG. 4, and then the operation with a DC control routine is described with reference to FIG. 5 later.

Figure 4:
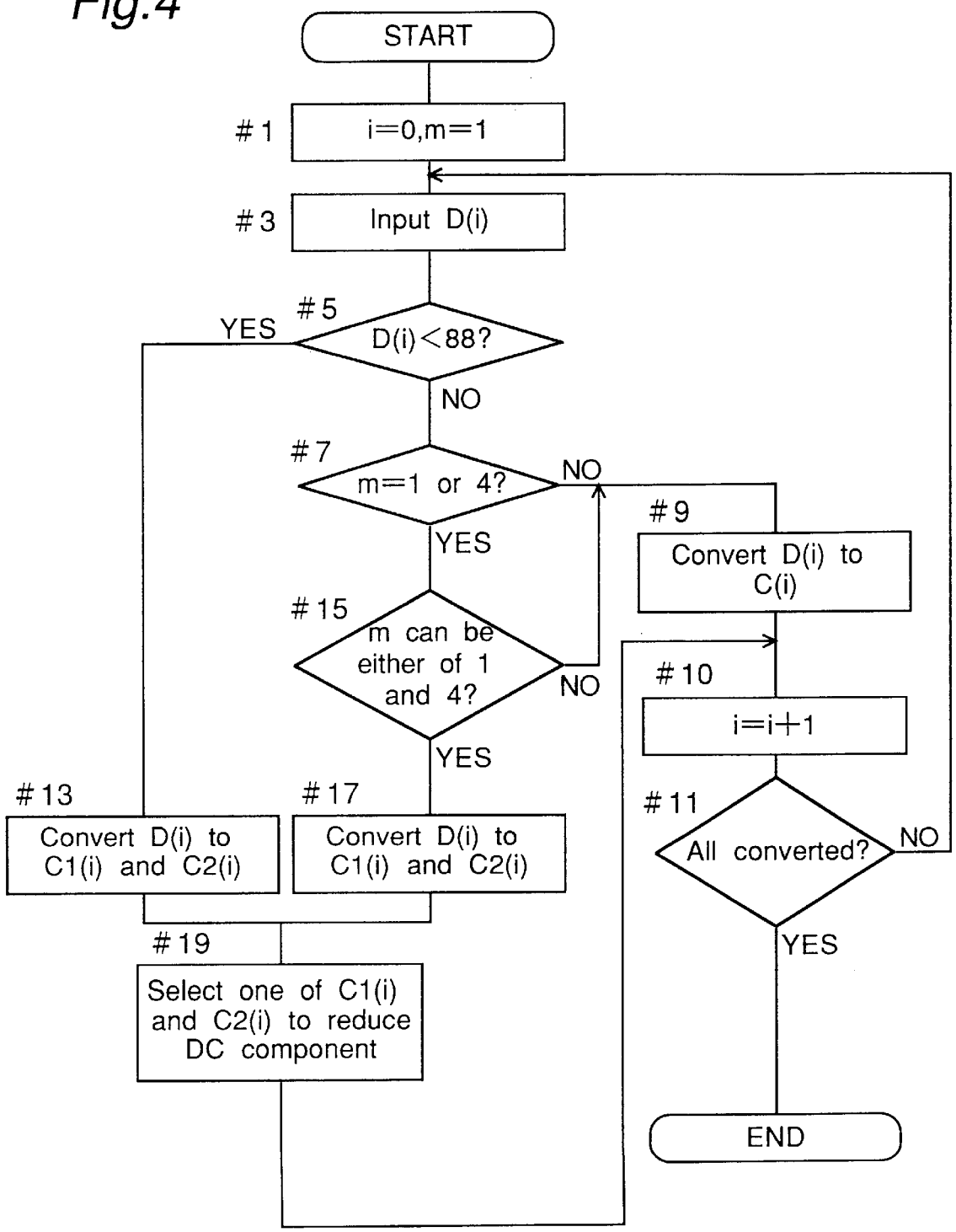
FIG. 4 is a flow chart in assistance of explaining a concept of the digital modulation according to the present invention.

Referring to FIG. 4, a flow chart of conceptual operation according to the present invention is shown.

When the operation starts, at step #1, i is set to 0, and m is set to 1. Thus, at the start of the operation, the byte counter (i) is cleared, and the STATE1 (indicated by the state index m) is set.

At step #3, the data word D(i) in the (n+1)-th order is input.

At step #5, it is judged whether the value of data word D(i) is less than 88 or not. When it is judge "YES", meaning that the data words D(i), the procedure advances to step #13.

At step #13, the data word D(i) is temporarily converted to first and second code word candidates C1(i) and C2(i) with the conversion tables Tp(m) and Ts(m) currently indicated the state index m. Then, the procedure advances to step #19.

At step #19, either one of two code words C1(i) and C2(i) produced at step #13, advantages for reducing the DC component is selected. Then the byte counter (i) is incremented at step #10, and the procedure advances to step #11.

At step #11, when it is judged whether all data words D had been converted or not. On the other hand, if it is judged "NO" at step #5, the procedure advances to step #7.

At step #7, it is judged whether the state number index is either one of 1 and 4, or not. When it is judged "YES", meaning that conversion tables for STATE1 or STATE4 are currently used, the procedure advances to step #15.

At step #15, it is judged whether the currently adopted state number indexes 1 or 4 can be replaced by the other index 4 or 1, respectively. For example, when the conversion tables Tp(m=1) are currently selected, it is judged whether the conversion table Tp(m=4) can be used instead of the currently selected table Tp(m=1) without violating the run-length limitation, i.e., (2,10) constraint at the connecting part, or not. When it is judged "YES", the procedure advances to step #17.

At step #17, the data word D(i) is temporarily converted to the first code word candidate C1(i) with the conversion tables Tp(m=1) and to the second code work candidate C2(i) with the conversion tables Tp(m=4). Then, the procedure advances to step #10.

However, when it is judged NO at step #7 or step #15, it means that changing the currently selected conversion table Tp(m−1 or 4) cannot be replaced by other possible tables Tp(m=4 or 1). The procedure advances to step #9.

At step #9, the data word D(i) is converted to the code word C(i) with the conversion tables Tp(m) currently indicated by the state number index m. Then the procedure advances to step #11.

At step #11, when it is judged "YES", meaning that all data word D(i) had been converted, then the control terminates.

Figure 5:
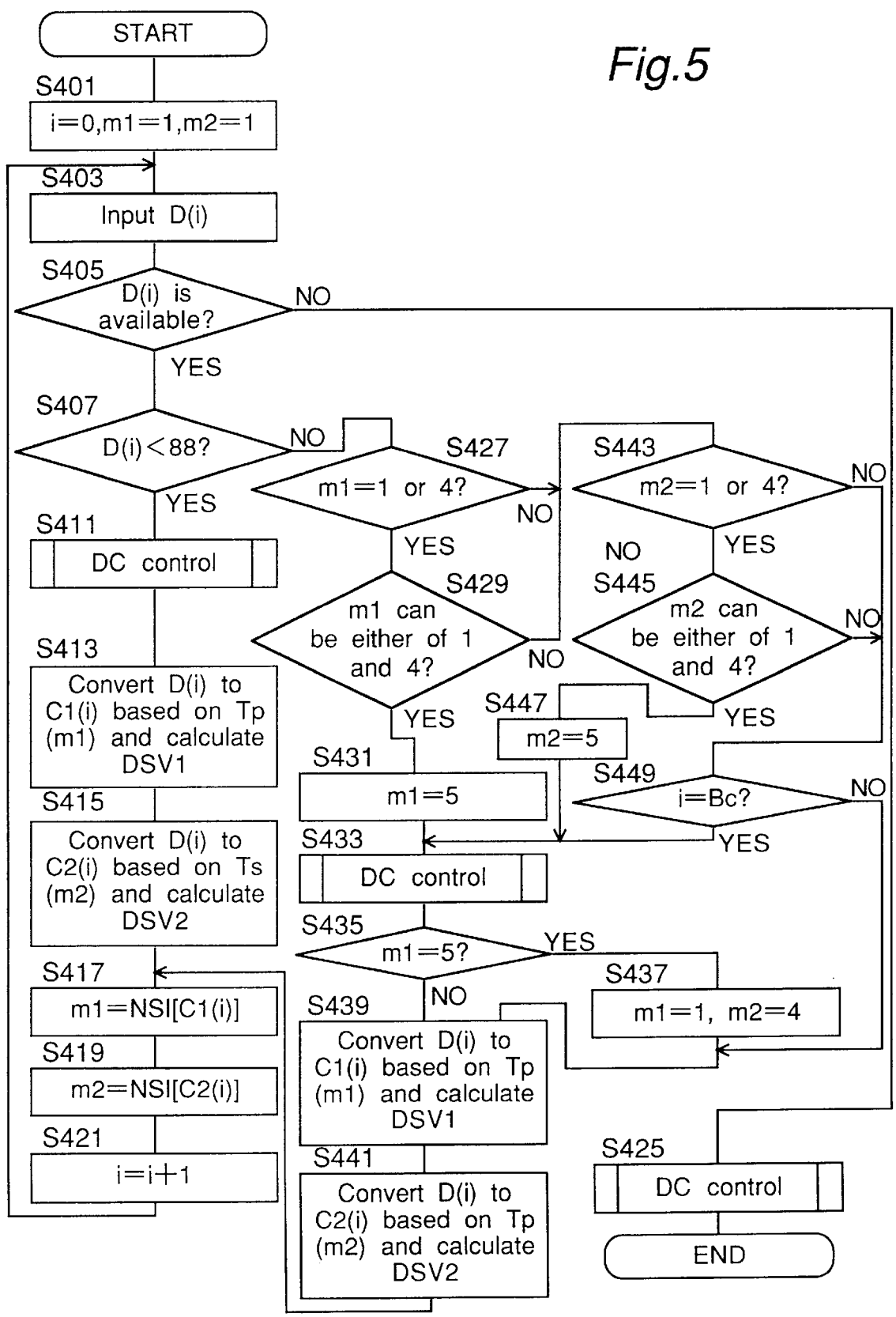
FIG. 5 is a flow chart showing an operation of the digital modulation apparatus of FIG. 1.

Referring to FIG. 5, the operation of the a digital modulation apparatus DMA of FIG. 1 is shown. Note that even those steps executed in parallel on the time base are for ease of description shown and described as serially executed on the time base.

The first step S401 is to initialize the control variables i=0, m1=1, and m2=1 where i is incremented in synchronization with data words D that are inputted to the digital modulation apparatus DMA, and is cleared when a DC control is performed. m1 is the next state used to determine the code word C1(i) for the first look-ahead channel (the data bus from which the code words C1 stored to the one buffer memory 105a are processed), and m2 is the next state used to determine the code word C2(i) for the second look-ahead channel (the data bus from which the code words C2 stored to the other buffer memory 105b are processed).

When one data word D(i) is then input to the preceding converter 101 (step S403), the DSV controller 108 determines whether the input data word D(i) is data word less than 88 (step S407).

Figure 6:
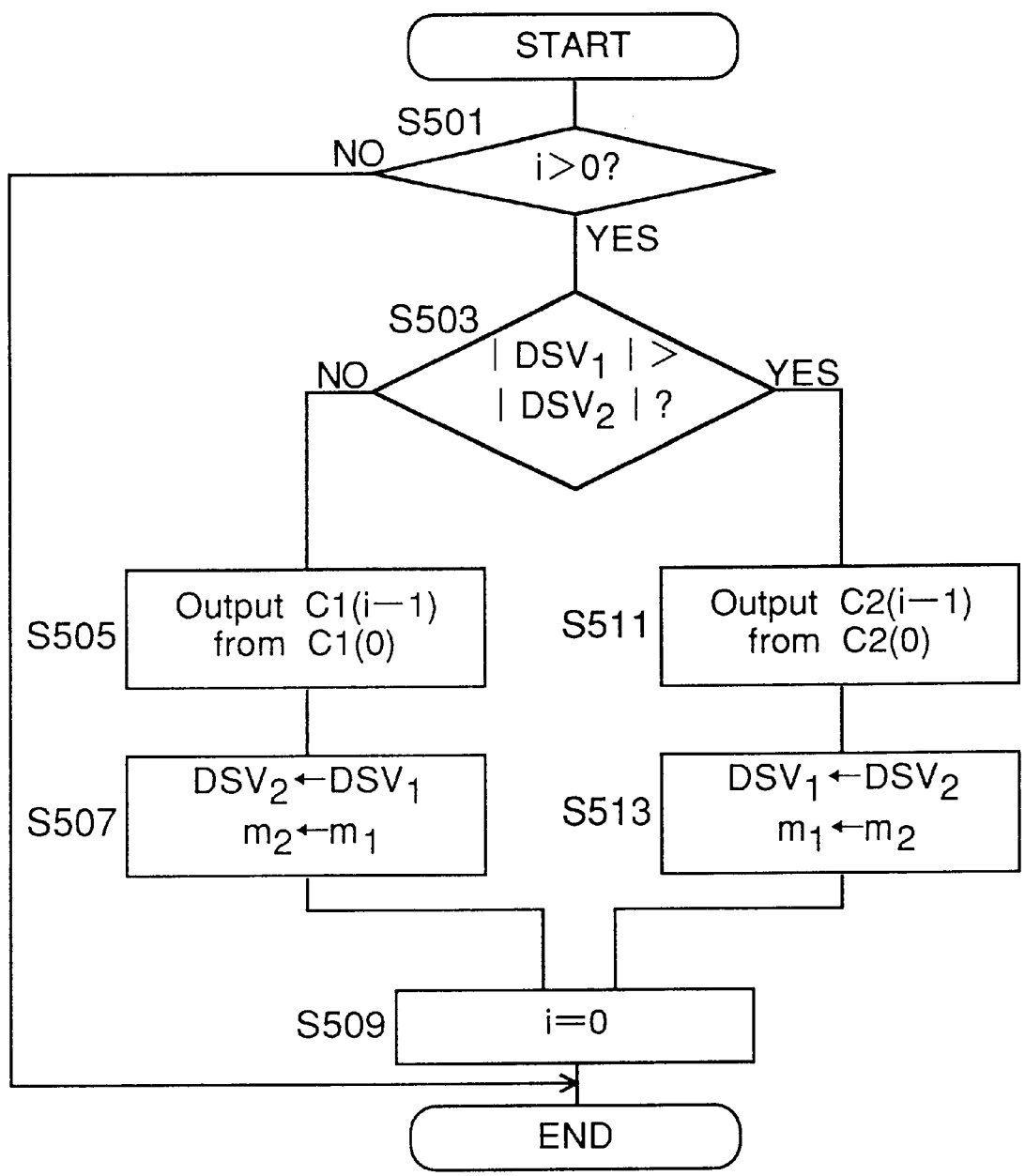
FIG. 6 is a flow chart showing a DC control subroutine step shown in the flow chart in FIG. 5.

If the input data word D(i) is data word less than 88, the DCC flags Fd1 and Fd2 are set, and then a DC control routine is executed in step S411. Note that DC control routine is a typical look-ahead process executed when a DSV-controllable code word is selected, and is shown in the flow chart in FIG. 6.

More specifically, when the DSV controller 108 detects that DCC flag Fd1 or DCC flag Fd2 is set, the DSV values DSV1 and DSV2 stored in the DSV counters 103a and 103b are read and the absolute values thereof are compared (step S503). The buffer memory 105a or 105b storing code word sequence corresponding to the smaller of the two values is then selected, the code word sequence stored in the selected buffer memory is output from the digital modulation apparatus through the selector 107a and parallel-serial converter 102c (steps S505 and S511), and the DSV counters 103a and 103b and control variables (m1 or m2, and i) are updated (steps S507, S513, and S509).

Referring back to FIG. 5, when DC control routine is completed, the input data word D(i) is converted to the corresponding code word C1(i) from the primary conversion table of the state declared by m1, and stored to buffer memory 105a through the parallel-serial converter 102a. Then, the first digital sum variation DSV1 is calculated (step S413). The same input data word D(i) is simultaneously converted to the corresponding code word C2(i) from the secondary conversion table of the state declared by m2, and stored to buffer memory 105b through the parallel-serial converter 102b. The second digital sum variation DSV2 is also calculated (step S415).

The information related to the next states obtained with the code words C1(i) and C2(i) is stored to the control variables m1 and m2 (steps S417 and S419).

If all necessary data words have been input (step S405), the code words accumulated by that time are output (step S425), and operation of the digital modulation apparatus terminates. If all data words have not been input (step S405), however, the variable i is incremented (step S421), and the apparatus awaits input of the next data word.

If it is determined in step S407 that the data word D(i) is greater than 87, it is determined whether the current m1 state on the first look-ahead channel is state 1 or state 4, and whether the runlength constraints will be violated if the state is switched between state 1 and state 4 (step S419). If the code words from states 1 and 4 can both be used, the m1 variable is set to 5, STATE5, (step S431), and the DC control routine is executed (step S433). Note that setting m1 to state 5 is equivalent to setting the DCC flag Fd1 in FIG. 2.

However, if it is determined that the current m1 state on the first look-ahead channel cannot be either state 1 or state 4, this evaluation is repeated for the second look-ahead channel (channel 2) (step S443). If it is thus determined that the data word D(i) to be converted can be converted to either state 1 or state 4 on channel 2, and a DSV-controllable code word can be obtained, m2 is set to 5 (step S447), and DC control routine is executed (step S433). Note that setting m2 to 5 is equivalent to setting the DCC flag Fd2 in FIG. 2.

After DC control routine is completed (step S433), the state value m1 of the first look-ahead channel is evaluated (step S435). If m1 is 5, m1 is updated to 1 and m2 is updated to 4 (step S437); m1 is otherwise left unchanged.

If in step S435 it is determined that m1 is not 5, or if the process in step S347 is completed, the data word D(i) is converted to code word C1(i) from the primary conversion table associated with the state declared by m1 and stored to buffer memory 105a (step S439), and is simultaneously converted to code word C2(i) from the primary conversion table associated with the state declared by m2 and stored to buffer memory 105b (state S441). Note that the DSV values DSV1 and DSV2 are calculated at step S439 and S441, respectively.

By means of the process executed from steps S427 to S431 above, the dynamic control method of switching to state 1 (STATE1) or state 4 (STATE4) during conventional implementation of the EFMplus conversion technique is improved by means of the present invention. More specifically, if there is a transition to state 1 (STATE1) or state 4 (STATE4) in the digital modulation apparatus of the present invention, the state transition is not automatically designated, but is intelligently selected so as to suppress the DC component in the output channel signal. In other words, it is determined whether the code word candidate enables DSV control, and if it does, the DSV-controllable code word is dynamically selected.

If the input data word D(i) does not correlate to a DSV-controllable code word, the data word is converted to a uniformly definable code word and stored in the buffer memories 105a and 105b (steps S449-S441). However, because a maximum look-ahead count is set to an integral number Bc, e.g., 15, due to the storage capacity of the buffer memories 105a and 105b, remaining storage room of the buffer memories is also monitored (steps S449). Note that because one DSV-controllable synchronization code is inserted for every 91 code words, the step S449 can be eliminated by increasing the look-ahead count to 91 words.

Operation of the Digital Demodulation Apparatus

Once data words are written by the digital modulation apparatus described above to a recording medium, it is necessary to read the recorded code words from the recording medium and demodulate the read code words to the original data words. This process is described below with reference to FIG. 7, a block diagram of a digital demodulation apparatus for this purpose.

Figure 7:
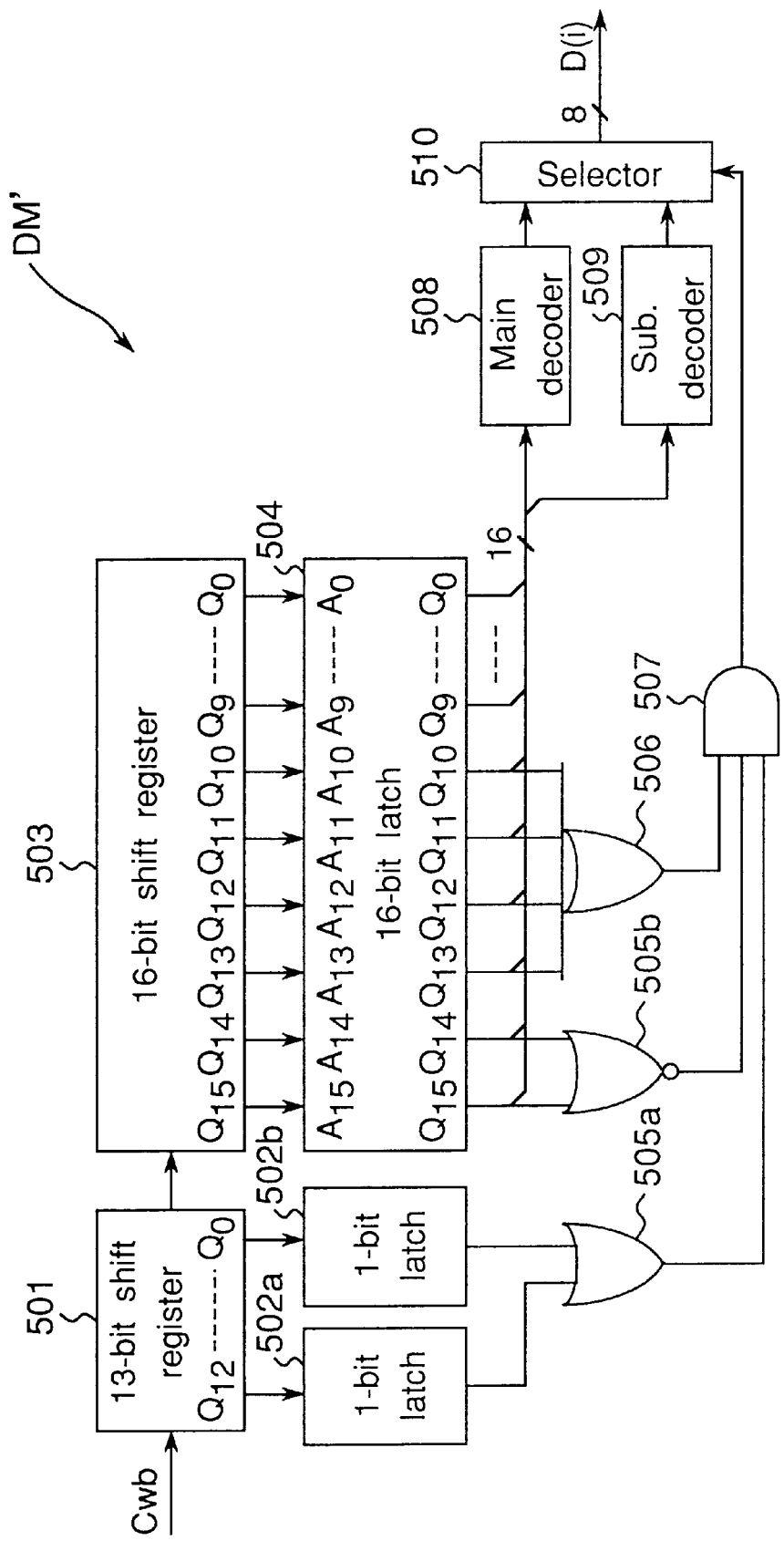
FIG. 7 is a block diagram showing a digital demodulation apparatus according to the present invention.

Referring to FIG. 7, this digital demodulation apparatus DM' comprises a 13-bit shift register 501, 1-bit latches 502a and 501b, a 16-bit shift register 503, a 16-bit latch 504, a 2-input OR gate 505a, a 2-input NOR gate 505b, 4-input OR gate 506, an AND circuit 507, a main decoder 508, a sub decoder 509, and a selector 510 that are mutually connected as shown. Note that this digital demodulation apparatus DM' corresponds to the reversed code converter 2003 shown in the digital modulation/demodulation apparatus shown in FIG. 8.

The main decoder 508 stores the correlation between all code words and data words for which there is no duplication, i.e., the correlation for which there is only one code word for each data word, and the duplicate correlation for which the next state is state 2. If the code word to be decoded is a code word belonging to either of these correlation sets, it can be decoded uniquely to the corresponding original data words.

The sub decoder 508 stores only the duplicate correlation for which the next state is state 3, and can thus uniquely decode code words belonging to this correlation set to the corresponding original data word.

The operation of the digital demodulation apparatus thus comprised is described blow.

The code words read from the recording medium are input as a bit sequence to the 13-bit shift register 501, and are forwarded to the 16-bit shift register 503 when the next code word is input. The code word passed to the 16-bit shift register 503 at this time is considered below. Note that inputting the code word to the 16-bit shift register 503 enables the AND circuit 507 to detect when the following conditions are satisfied.

The conditions tested by the AND circuit 507 determine (1) if bit-1 QO and/or bit-13 Q12 in the next code word following the present code word is one, and (2) if bit-16 Q15 and bit-15 Q14 in the present code word are both zero, and (3) if any one bit from bit-11 Q10 to bit-14 Q13 in the present code word is one.

If both conditions (2) and (3) above are true, the end runlength of the present code word ranges from 2 to 5, inclusive. As a result, it is determined that the next code word is state 2 or state 3 as shown in FIG. 12. Condition (1) means that the next code word is not state 2 as will be known from FIG. 11. It can therefore be determined that the next code word is state 3 if all three conditions (1), (2), and (3) are true.

When the AND circuit 507 detects the above conditions to be true, it selects and outputs a data word from the sub decoder 509 by controlling the selector 510. When the above conditions are not true, the AND circuit 507 selects and outputs a data word from the main decoder 508.

As a result of this operation, code words read from the recording medium are uniquely decoded to the original data word by means of the main decoder 508 or the sub decoder 509 irrespective of the state used for modulation and irrespective of whether a duplicate code word is used.

It should be noted that while the digital modulation apparatus of the preferred embodiments are described as implementing a (2, 10; 8, 16) sequence constraint conversion, the present invention shall not be limited to these constraint values. It will be obvious to those skilled in the art that the present invention can also be applied to fixed-length code word conversion converting data words of a fixed length to code words having a constant runlength constraint.

The digital modulation apparatus of the preferred embodiments is also described using a look-ahead method for DSV control, but the present invention shall not be so limited and other DSV control techniques may be applied. The present invention does not relate specifically to the method of controlling the DSV, but is characterized by enabling DSV control in conversions that do not allow for DSV control in conventional (EFMplus) conversion methods.

Furthermore, the digital modulation apparatus of the present embodiments uses ROM tables for the conversion tables, but can alternatively use random logic combinational circuits as the storage means.

Furthermore, the digital modulation apparatus of the present embodiments selects the code word resulting in the lowest absolute value in the final DSV during DSV control as a means of suppressing the low frequency component in the NRZI signal, but the same effect can be achieved by selecting the code word resulting in the lowest peak value of the absolute DSV values during the look-ahead period, or selecting the code word resulting in the lowest sum of squares of the DSV, i.e., the lowest DSV distribution, at each time point during the look-ahead period.

It should also be noted that while the state1 (STATE1) to state4 (STATE4) ROM tables 201a to 201d assign 26 bits to each code word, the 4 bits declaring the initial runlength of the state 2 (STATE2) and state 3 (STATE 3) ROM tables 201b and 201c do not affect operation and can be omitted. In addition, the 4 bits declaring the end runlength when the next state is state 2 (STATE2) or state 3 (STATE3) can also be similarly omitted.

In one aspect of the invention, a digital modulation apparatus DMA and a digital modulation method for converting data words to runlength-limited code words comprise a storage means for storing plural types of conversion tables of code words corresponding to all possible data words, a selection means or step, respectively, for selecting from among the plural conversion tables the next conversion table to be used based on the code word obtained from the immediately preceding conversion, and a reading means or step, respectively, for reading and outputting the code word corresponding to the data word to be converted from the conversion table selected by the selection means.

The selection means or step selects the conversion tables that convert the data words to code words whereby the runlength constraints are also satisfied in the interconnection between the code word obtained by the immediately preceding conversion and the code word obtained by the following conversion, and assigns the code word resulting in the most favorable digital sum variation (DSV) in the signal after the code words are non-return-to-zero inverted (NRZI) converted when there are plural conversion tables whereby the next code word can be assigned such that both said code words can be decoded to the original data words.

When a data word to be converted is supplied to this digital modulation apparatus or method, one of plural predefined conversion tables is selected. The selected conversion table is the table whereby the data word is converted to the code word achieving the greatest suppression of the low frequency component in the resulting NRZI signal insofar as the runlength constraints are satisfied in the interconnection between the code word converted immediately before and the code word obtained from the following conversion. As a result, the conversion table used for the next conversion is not determined automatically according to the designation by the code obtained from the immediately preceding conversion, but is determined intelligently to obtain the code word resulting in the greatest low frequency component suppression in the NRZI signal.

In another aspect of the invention, in the digital modulation apparatus and the digital modulation method, each of the plural conversion tables is characterized by correlating to all data words only those code words of which the initial runlength is within a specific range defined for each type of conversion table, and plural code words correlate to a specific data word; and the selection means (method) is characterized by selecting the conversion table based only on the code word converted immediately before when the data word is one of the preceding specific data words, and the code word is selected so that the digital sum variation (DSV) in the signal obtained by NRZI-converting the converted code word is in an optimum state.

With this digital modulation apparatus and method the conversion tables are compiled so that plural code words correlate to a specific data word, and when one of those specific data words is supplied, the code word obtaining the best-state DSV in the final NRZI signal is selected. As a result, the apparatus and method of the present invention more effectively suppress the low frequency component of the NRZI signal.

In a further aspect of the invention, in the digital modulation apparatus and the digital modulation method, the selection means (method) comprises a first memory unit and a second memory unit with capacity for storing plural consecutive code words; an evaluation means (method) for determining whether there are two types (first and second) of conversion tables containing code words satisfying the sequence constraints in the interconnection between the code word obtained from the immediately preceding conversion and the code word obtained from the following conversion; a storage means (method) for storing to the first memory unit the code word contained in the first conversion table and the following code word, and storing to the second memory unit the code word contained in the second conversion table and the following code word, when it is determined by the evaluation means that there are two usable conversion tables; a comparison means (method) that compares the magnitude of the absolute value of a first look-ahead DSV calculated from the code words obtained to that point and stored in the second memory unit when it is determined by the evaluation means that there are two usable conversion tables producing the code word following at least the code word sequence stored to the second memory unit; a look-ahead selection means (method) that selects the first code word sequence as the more preferable conversion table when the comparison means determines that the absolute value of the first look-ahead DSV is smaller, and selects the second code word sequence as the more preferable conversion table when the comparison means determines that the absolute value of the first look-ahead is not smaller.

When it is possible to select two different conversion tables for a single specific data word to be converted, the apparatus and method of this embodiment do not specify the conversion table to be used based on the DSV of the code words output to that point, but specify the conversion table to use after considering the DSV of the code words that may be obtained by the time a state in which two conversion tables can be selected occurs again. This look-ahead method controls low frequency component suppression with consideration for the code words that may result from subsequent conversions, and therefore has a greater effect suppressing the low frequency component of the NRZI signal when compared with methods considering only the code words that have already been selected.

In yet another aspect of the invention, a recording medium and digital modulation methods are characterized by the data words being recorded.

With this recording medium, the data words recorded thereto are arrayed so that constant runlength constraints are satisfied and a constant low frequency component suppression can be achieved. Recording medium to which data words are thus recorded exhibit the following effects. Specifically, the apparatus for reproducing this recording medium can read a NRZI signal in which the low frequency component is effectively suppressed. Thus, the probability of read errors caused by threshold value fluctuations occurring when this signal is digitized is effectively suppressed below a constant value, and the probability of variations in the servo error signal occurring during reproduction is also effectively suppressed.

As apparent from the above, when a data word to be converted is supplied to a digital modulation apparatus or method, one of plural predefined conversion tables is selected where the selected conversion table is that from which a code word satisfying the runlength constraints and resulting in the greatest low frequency component suppression in the final NRZI signal can be selected. The selected conversion table is then used to convert the data word to a code word.

It is therefore possible to obtain a code word enabling maximum suppression of the low frequency component in the final NRZI signal without reducing the recording density as occurs with conventional conversion methods such as EFMplus in which the selection of the next conversion table from among plural conversion tables is automatically designed by the previous code word.

With the digital modulation apparatus or method, plural code words correlate to each of data words within a specific range, and data words are converted to code words based on conversion tables in which the code words are uniformly defined to suppress the low frequency component. The effect of this operation is to suppress the low frequency component more efficiently than methods in which there is only one code word correlating to each data word even though the complexity of the processing operation is simplified.

Low frequency component suppression control is accomplished using a look-ahead method in the digital modulation apparatus or method. The low frequency component is thus suppressed more than with suppression techniques which only consider the currently obtained code words.

The recording medium records the NRZI signal obtained by the digital modulation method, i.e., a signal in which the low frequency component is suppressed more than it is by conventional modulation methods. Fluctuations in the threshold value when digitizing the reproduction signal, and variations resulting from the servo error signal, are therefore suppressed in the apparatus used to reproduce this recording medium.

It is therefore possible by means of the present invention thus described to achieve a high quality recording medium characterized by a high recording density and a low error rate during both writing and reading operations, and to achieve a digital modulation apparatus for producing said recording medium.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A digital modulation apparatus for converting data words to runlength-limited code words, comprising:

a storage device that stores plural sets of conversion tables correlating said code words to said data words,;

a selector that selects a set of conversion tables to be used from among said plural sets of conversion tables, based on a code word obtained from an immediately preceding conversion; and a reader that reads and outputs said code word corresponding to said data word to be converted from said conversion table selected by said selector, wherein said selector selects a set of conversion tables that converts the data word to the code word so that a runlength constraint is satisfied in an interconnection between a preceding code word obtained by said immediately preceding conversion and a code word obtained by a following conversion, when said selector selects plural sets of conversion tables that satisfy a runlength constraint, each assigning a decodable code word to the data word, said selector further selects the conversion table assigning a code word resulting in the most favorable digital sum variation in a non-return-to-zero inverted (NRZI) converted signal assembled from the code words, each of said plural sets of conversion tables correlating only code words in which an initial runlength is within a range defined for each type of conversion table to corresponding data words, and correlating plural code words to each of particular data words, and said selector selecting the conversion table based only on an immediately converted code word when the data word is a particular data word, and selects said code word resulting in a most favorable digital sum variation in the signal after NRZI conversion of said converted code word.

2. The digital modulation apparatus of claim 1, wherein said selector comprises:

a first memory;

a second memory, said first memory and said second memory each having a capacity for storing plural consecutive code words;

an evaluator that determines whether two conversion tables of different sets contain said code word satisfying said runlength constraints in said interconnection between said code word obtained from said immediately preceding conversion and said code word obtained from said following conversion;

a storing device that stores a code word contained in a first conversion table and a code word following thereafter to said first memory and a code word contained in a second conversion table and a code word following thereafter being stored in said second memory when it is determined by said evaluator that there are two usable conversion tables;

a comparator that compares a magnitude of an absolute value of a first look-ahead DSV calculated from said code words obtained to that point and stored in said first memory with a magnitude of an absolute value of a second look-ahead DSV calculated from said code words obtained to that point and stored in said second memory, when it is determined by said evaluator that there are two usable conversion tables producing said code word following one of said code word sequence stored to said first memory and said code word sequence stored to said second memory; and a look-ahead selection device that selects a first code word sequence as a more preferable code word sequence when said comparison means determines that said absolute value of said first look-ahead DSV is smaller than said absolute value of said second look-ahead DSV, and selects a second code word sequence as said more preferable code word sequence when said comparison means determines that said absolute value of said first look-ahead DSV is not smaller than said absolute value of said second look-ahead DSV.

3. A digital modulation method for converting data words to runlength-limited code words, comprising:

assembling plural sets of conversion tables correlating said code words to said data words;

selecting a next set of conversion tables to be used from among the plural sets of conversion tables, based on a code word obtained from an immediately preceding conversion; and reading and outputting a code word corresponding to a data word to be converted from the selected conversion table, wherein a set of conversion tables is selected that converts the data word to a code word so that a runlength constraint is satisfied in an interconnection between a preceding code word obtained by an immediately preceding conversion and a code word obtained by a next conversion, and when there are plural conversion tables that satisfy a runlength constraint, each of which assigns a code word able to be decoded to an original data word, each selected conversion table is the conversion table assigning a code word resulting in the most favorable digital sum variation in a non-return-to-zero inverted (NRZI) converted signal assembled from the code words, each of said plural types of conversion tables correlating only code words of which, an initial runlength is within a range defined for each type of conversion table to corresponding data words and correlating plural code words to each of particular data words said selected set of conversion tables being based only on a code word converted immediately before the data word is selected as a particular data word, and wherein said selecting selects the code word resulting in the most favorable digital sum variation in a signal after NRZI conversion of the converted code word.

4. The digital modulation method of claim 3, wherein said selecting determines whether there are first and second conversion tables containing code words satisfying the run-length constraints in the interconnection between a code word obtained from an immediately preceding conversion and a code word obtained from a following conversion and further comprising:

storing a code word contained in the first conversion table and a code word following thereafter to a first memory and a code word contained in the second conversion table and a code word following thereafter to a second memory, when it is determined that there are two usable conversion tables;

comparing a magnitude of an absolute value of a first look-ahead DSV calculated from the code words obtained to that point and stored in said first memory with a magnitude of an absolute value of a second look-ahead DSV calculated from the code words obtained to that point and stored in said second memory when it is determined that there are two usable conversion tables producing the code word following one of the code word sequence stored to said first memory and the code word sequence stored to said second memory; and selecting the first code word sequence as a more preferable code word sequence when it is determined that the absolute value of the first look-ahead DSV is smaller than the absolute value of the second look-ahead DSV, and selecting the second code word sequence as the more preferable code word sequence when it is determined that the absolute value of the first look-ahead DSV is not smaller than the absolute value of the second look-ahead DSV.

5. The digital modulation method of claim 3, comprising using a recording medium to carry data words thereon.

6. The digital modulation method of claim 4, comprising using a recording medium to carry data words thereon.

* * * * *

UNITED STATES PATENT AND TRADEMARK OFFICE
CERTIFICATE OF CORRECTION

PATENT NO.   : 5,917,857
DATED        : June 29, 1999
INVENTOR(S)  : S. TANAKA et al.

It is certified that error appears in the above-identified patent and that said Letters Patent is hereby corrected as shown below:

At column 17, line 51 (claim 1, line 22) of the printed patent, "the" should be ---a---.

At column 17, line 62 (claim 1, line 33) of the printed patent, "a" should be ---the---.

At column 18, line 64 (claim 3, line 26) of the printed patent, after "which" delete " , ".

At column 18, line 66 (claim 3, line 29) of the printed patent, after "words" insert --- , ---.

Signed and Sealed this

Eighteenth Day of July, 2000

Attest:

Q. TODD DICKINSON

*Attesting Officer*                *Director of Patents and Trademarks*